US012738300B2

(12) United States Patent
Cui et al.

(10) Patent No.: US 12,738,300 B2
(45) Date of Patent: Sep. 15, 2026

(54) POWER SUPPLY CONTROL CIRCUIT, METHOD AND APPARATUS FOR STORAGE SYSTEM, AND STORAGE MEDIUM

(71) Applicant: SUZHOU METABRAIN INTELLIGENT TECHNOLOGY CO., LTD., Suzhou (CN)

(72) Inventors: Xuetao Cui, Suzhou (CN); Yaoyu Hua, Suzhou (CN); Qingpeng Shi, Suzhou (CN); Lupan Wang, Suzhou (CN); Gangqiang Cao, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/117,386

(22) PCT Filed: Dec. 15, 2023

(86) PCT No.: PCT/CN2023/139270
§ 371 (c)(1),
(2) Date: Mar. 31, 2025

(87) PCT Pub. No.: WO2024/183393
PCT Pub. Date: Sep. 12, 2024

(65) Prior Publication Data

US 2026/0011352 A1 Jan. 8, 2026

(30) Foreign Application Priority Data

Mar. 8, 2023 (CN) ........................ 202310218223.4

(51) Int. Cl.
*G06F 13/40* (2006.01)
*G11C 5/14* (2006.01)

(52) U.S. Cl.
CPC .......... *G11C 5/143* (2013.01); *G06F 13/4081* (2013.01); *G11C 5/145* (2013.01); *G11C 5/148* (2013.01)

(58) Field of Classification Search
CPC ......... G11C 5/143; G11C 5/145; G11C 5/148; G06F 13/4081

(Continued)

(56) References Cited

U.S. PATENT DOCUMENTS

| | | | | |
|---|---|---|---|---|
| 2002/0104031 A1* | 8/2002 | Tomlinson | G06F 1/24 | 713/320 |
| 2004/0057182 A1* | 3/2004 | Yuan | G06F 13/4081 | 361/100 |

(Continued)

FOREIGN PATENT DOCUMENTS

| | | |
|---|---|---|
| CN | 101888182 A | 11/2010 |
| CN | 106774772 A | 5/2017 |

(Continued)

OTHER PUBLICATIONS

The search report of CN application No. 202310218223.4 issued on Apr. 11, 2023.

(Continued)

*Primary Examiner* — Sung Il Cho
(74) *Attorney, Agent, or Firm* — Scully, Scott, Murphy & Presser, P.C.

(57) ABSTRACT

A power supply control circuit, method and apparatus for a storage system, and a non-volatile readable storage medium are provided. The control circuit includes: a signal processing module and a driving module, wherein a first input end of the signal processing module is connected to an initial output end of a hot-swap control chip deployed in the storage system, a first output end of the signal processing module is connected to a second input end of the driving (Continued)

module, a second output end of the driving module is connected to a control end of a hot-swap device deployed in the storage system, and the initial output end is also connected to the control end.

16 Claims, 9 Drawing Sheets

(58) Field of Classification Search
USPC .......................................................... 365/226
See application file for complete search history.

(56) References Cited

U.S. PATENT DOCUMENTS

2008/0122500 A1* 5/2008 Suzuki ...................... G06F 1/24 327/143
2008/0126814 A1* 5/2008 Burkland ............ G06F 13/4081 713/300
2019/0305606 A1 10/2019 Jiang
2023/0132884 A1* 5/2023 Huang ..................... H03K 5/01 327/540

FOREIGN PATENT DOCUMENTS

CN 107222090 A 9/2017
CN 110890783 A 3/2020
CN 111858427 A 10/2020
CN 113991599 A 1/2022
CN 216872849 U 7/2022
CN 115933851 A 4/2023

OTHER PUBLICATIONS

The search report of PCT application No. PCT/CN2023/139270 issued on Mar. 15, 2024.
The written opinion of PCT application No. PCT/CN2023/139270 issued on Mar. 15, 2024.

* cited by examiner

Start

Whether a PUS branch is on

No

One-second power-down test state

Detect that the BBU is pulled out or receive a test end command sent by the CPU

No

Startup state

Yes

Yes

Yes

Hotswap_EN=1
TURBO_EN=1

Hotswap_EN=1
TURBO_EN=0

After a latency of 100 ms, Hotswap_EN=0
TURBO_EN=0

No

End

POWER SUPPLY CONTROL CIRCUIT, METHOD AND APPARATUS FOR STORAGE SYSTEM, AND STORAGE MEDIUM

CROSS-REFERENCE TO RELATED APPLICATION

The present disclosure claims the priority to the Chinese patent application No. 2023102182234, titled "POWER SUPPLY CONTROL CIRCUIT, METHOD AND APPARATUS FOR STORAGE SYSTEM, AND STORAGE MEDIUM", filed to the China National Intellectual Property Administration on Mar. 8, 2023, which is incorporated herein in its entirety by reference.

TECHNICAL FIELD

Embodiments of the present disclosure relate to the technical field of storage devices, and in particular, to a power supply control circuit, method and apparatus for a storage system, and a non-volatile readable storage medium.

BACKGROUND

A storage system is one of the critical constituent parts of a computer. The storage system provides the ability to write and read information (programs and data) required by the computer for working, realizing an information memory function of the computer. In the era of big data, a higher requirement is imposed on the reliability of the storage system, particularly a speed of supplying power to the storage system.

Currently, in order to improve the fault recovery capability and scalability of the storage system, components of a storage device, such as a server power supply unit (PSU), a hard disk, and a fiber card, increasingly support a hot swap function. The hot swap function allows a user to remove and replace a damaged component such as a hard disk, a power supply and a board, without turning off the system or cutting off the power supply, thereby improving the timely disaster recovery ability, scalability and flexibility of the system. In an existing storage system, power supply to the storage system by a backup battery is controlled by means of an instruction sent by a hot-swap control chip to a hot-swap device. Turning-on time of the hot-swap device deployed in the storage system determines a speed of powering on the storage system. However, in an existing control method, the turning-on time of the hot-swap device is fixed, and under the requirements of different working states of the storage system, for example, testing whether a power supply function is normal, etc., the adaptability of the speed of powering on the storage system is very low.

With respect to the problem of low adaptability of the speed of powering on the storage system in the related art, no effective solution has been proposed yet.

SUMMARY

Embodiments of the present disclosure provide a power supply control circuit, method and apparatus for a storage system, and a non-volatile readable storage medium.

According to some embodiments of the present disclosure, a power supply control circuit for a storage system is provided, the power supply control circuit includes: a signal processing module and a driving module, and a first input end of the signal processing module is connected to an initial output end of a hot-swap control chip deployed in the storage system, a first output end of the signal processing module is connected to a second input end of the driving module, a second output end of the driving module is connected to a control end of a hot-swap device deployed in the storage system, and the initial output end is also connected to the control end.

In a case that target turning-on time of the hot-swap device is less than or equal to a time threshold, the driving module connects the second input end to the second output end, the initial output end outputs an initial hot-swap signal to the first input end, the signal processing module converts the initial hot-swap signal into a target hot-swap signal, the first output end outputs the target hot-swap signal to the second input end, and the second output end outputs the target hot-swap signal to the control end, and the target hot-swap signal is greater than the initial hot-swap signal; and the hot-swap device controls, in response to the target hot-swap signal, a server power supply unit deployed in the storage system to supply power to the storage system.

In a case that the target turning-on time of the hot-swap device is greater than the time threshold, the driving module disconnects the second input end from the second output end, and the initial output end outputs the initial hot-swap signal to the control end; and the hot-swap device controls, in response to the initial hot-swap signal, the server power supply unit to supply power to the storage system.

In some embodiments, the signal processing module includes: a voltage amplification circuit and a current conversion circuit, and an input end of the voltage amplification circuit serves as the first input end and is connected to the initial output end, an output end of the voltage amplification circuit is connected to an input end of the current conversion circuit, and an output end of the current conversion circuit serves as the first output end and is connected to the second input end; and the voltage amplification circuit amplifies a voltage of the input initial hot-swap signal, to obtain a voltage-amplified signal; and the current conversion circuit converts the voltage-amplified signal into a current-amplified signal and outputs the current-amplified signal as the target hot-swap signal.

In some embodiments, the voltage amplification circuit includes: a first resistor, a second resistor, a third resistor, a fourth resistor, a fifth resistor, and a first operational amplifier, and a first end of the first resistor and a first end of the second resistor are both connected to the initial output end, a second end of the first resistor and a first end of the third resistor are both connected to the control end, a second end of the second resistor and a first end of the fourth resistor are both connected to an inverting input end of the first operational amplifier, a second end of the fourth resistor is grounded, a second end of the third resistor and a first end of the fifth resistor are both connected to a non-inverting input end of the first operational amplifier, and a second end of the fifth resistor and an output end of the first operational amplifier are both connected to an input end of the current conversion circuit.

In some embodiments, the second resistor and the third resistor have the same resistance, the fourth resistor and the fifth resistor have the same resistance, and the ratio of the resistance of the second resistor to the resistance of the fourth resistor is used to control an amplification factor of the voltage amplification circuit.

In some embodiments, the voltage amplification circuit further includes: a diode, and a cathode of the diode is connected to the initial output end, and an anode of the diode is connected to the control end.

In some embodiments, the current conversion circuit includes: a sixth resistor, a seventh resistor, a second operational amplifier, and a first metal-oxide-semiconductor (MOS) field-effect transistor (MOSFET), and a first end of the sixth resistor and a first end of the seventh resistor are both connected to an inverting input end of the second operational amplifier, a second end of the sixth resistor is grounded, a second end of the seventh resistor is connected to a source of the first MOS transistor, a non-inverting input end of the second operational amplifier is connected to the output end of the voltage amplification circuit, an output end of the second operational amplifier is connected to a gate of the first MOS transistor, and a drain of the first MOS transistor is connected to the second input end.

In some embodiments, the driving module includes: a mirror current circuit and a charge pump circuit, and a third input end of the mirror current circuit serves as the second input end and is connected to the first output end, a fourth input end of the mirror current circuit is connected to an output end of the charge pump circuit, an output end of the mirror current circuit serves as the second output end and is connected to the control end, and an input end of the charge pump circuit is connected to the server power supply unit; and the charge pump circuit controls output of a charge pump signal; in a case that the mirror current circuit receives the charge pump signal at the fourth input end, the third input end is connected to the output end of the mirror current circuit; and in a case that no charge pump signal is received at the fourth input end, the third input end is disconnected from the output end of the mirror current circuit.

In some embodiments, the mirror current circuit includes: a first triode and a second triode, and an emitter of the first triode is connected to the first output end, a base of the first triode is connected to a base of the second triode, a collector of the first triode and a collector of the second triode are both connected to the output end of the charge pump circuit, and an emitter of the second triode is connected to the control end.

In some embodiments, the charge pump circuit includes: a third triode, a fourth triode, an eighth resistor, a ninth resistor, and a charge pump, and a collector of the third triode is connected to the collector of the second triode, an emitter of the third triode and a first end of the ninth resistor are both connected to an output end of the charge pump, a first end of the eighth resistor and a second end of the ninth resistor are both connected to a base of the third triode, a second end of the eighth resistor is connected to a collector of the fourth triode, an emitter of the fourth triode is grounded, and an input end of the charge pump is connected to the server power supply unit;

the charge pump doubles an output voltage of the server power supply unit and then transmits the doubled output voltage to the emitter of the third triode and the ninth resistor; and a base of the fourth triode controls the charge pump signal by controlling on and off of the fourth triode and the third triode, and in a case that the fourth triode and the third triode are both turned on, the output end of the charge pump circuit generates the charge pump signal, and in a case that the fourth triode or the third triode is turned off, the output end of the charge pump circuit does not generate the charge pump signal.

In some embodiments, the driving module further includes: a processor, and the processor is connected to the base of the fourth triode; and the processor is configured to: in a case that the target turning-on time is less than or equal to the time threshold, send, to the base of the fourth triode, a first enable signal which is used to turn on the fourth triode, and in a case that the target turning-on time is greater than the time threshold, send, to the base of the fourth triode, a second enable signal which is used to turn off the fourth triode.

In some embodiments, the processor is further configured to:

detect an operating state of the storage system;

in a case that the operating state is a test state, determine that the target turning-on time is less than or equal to the time threshold, and the test state is used to indicate that the storage system is undergoing a backup power test; and in a case that the operating state is a working state, determine that the target turning-on time is greater than the time threshold, and the working state is used to indicate that the storage system is working.

According to some embodiments of the present disclosure, this disclosure provides a control method for power supply for a storage system, the method includes:

target turning-on time of a hot-swap device deployed in the storage system is detected, and the hot-swap device is configured to control, in response to a target control signal input to a control end of the hot-swap device, a server power supply unit deployed in the storage system to supply power to the storage system;

the target control signal is determined according to the target turning-on time and an initial hot-swap signal output by a hot-swap control chip deployed in the storage system; and the target control signal is sent to the control end.

In some embodiments, the target control signal is determined according to the target turning-on time and an initial hot-swap signal output by a hot-swap control chip deployed in the storage system, includes:

in a case that the target turning-on time is greater than a time threshold, the initial hot-swap signal is determined as the target control signal; and in a case that the target turning-on time is less than or equal to the time threshold, signal conversion is performed on the initial hot-swap signal to obtain the target control signal, and the target control signal is greater than the initial hot-swap signal.

In some embodiments, signal conversion is performed on the initial hot-swap signal to obtain the target control signal includes:

a voltage of the initial hot-swap signal is amplified to obtain a voltage-amplified signal; and the voltage-amplified signal is converted into a current-amplified signal to obtain a target hot-swap signal as the target control signal.

In some embodiments, the voltage of the initial hot-swap signal is amplified to obtain a voltage-amplified signal includes:

a voltage amplification factor is determined according to the target turning-on time; and the voltage of the initial hot-swap signal is amplified to obtain the voltage-amplified signal, according to the voltage amplification factor.

In some embodiments, the target control signal is determined according to the target turning-on time and an initial hot-swap signal output by a hot-swap control chip deployed in the storage system, includes:

the hot-swap control chip is controlled to output the initial hot-swap signal; and the signal processing module is controlled to be turned on or off according to a relationship between the target turning-on time and the time threshold, and the signal processing module is connected between the hot-swap control chip and the control end, and the hot-swap control chip is also connected to the control end. in a case that the signal processing module is on, the signal processing module performs signal conversion on the initial hot-swap signal to obtain the target control signal. in a case that the signal processing module is off, the initial hot-swap signal serves as the target control signal.

In some embodiments, the signal processing module is controlled to be turned on or off according to a relationship between the target turning-on time and the time threshold includes:

in a case that the target turning-on time is less than or equal to the time threshold, the signal processing module is controlled to be on; and in a case that the target turning-on time is greater than the time threshold, the signal processing module is controlled to be off.

In some embodiments, target turning-on time of the hot-swap device deployed in the storage system is detected, includes:

an operating state of the storage system is detected;

in a case that the operating state is a test state, it is determined that the target turning-on time is less than or equal to the time threshold, and the test state is used to indicate that the storage system is undergoing a backup power test; and in a case that the operating state is a working state, it is determined that the target turning-on time is greater than the time threshold, and the working state is used to indicate that the storage system is working.

In some embodiments, the power supply control method for a storage system is applied to a power supply control circuit for the storage system, and the power supply control circuit includes a signal processing module and a driving module, and a first input end of the signal processing module is connected to an initial output end of the hot-swap control chip, a first output end of the signal processing module is connected to a second input end of the driving module, a second output end of the driving module is connected to a control end of the hot-swap device, and the initial output end is also connected to the control end The driving module is configured to disconnect the second input end from the second output end in a case that the target turning-on time is greater than the time threshold, and the driving module is further configured to connect the second input end to the second output end in a case that the target turning-on time is less than or equal to the time threshold. The power supply control circuit is configured to perform signal conversion on the initial hot-swap signal by means of the signal processing module in a case that the target turning-on time is less than or equal to the time threshold.

In some embodiments, an operating state of the storage system is detected includes:

it is detected whether the server power supply unit is on;

in a case that detecting that the server power supply unit is not on, it is detected whether the storage system is in a startup state;

in a case that detecting that the storage system is in the startup state, it is determined that the operating state is a working state; and in a case that detecting that the storage system is in a non-startup state, it is determined that the operating state is a test state.

According to some embodiments of the present disclosure, a power supply control apparatus for a storage system is provided, the power supply control apparatus includes:

a detecting module, configured to detect target turning-on time of a hot-swap device deployed in the storage system, and the hot-swap device is configured to control, in response to a target control signal input to a control end of the hot-swap device, a server power supply unit deployed in the storage system to supply power to the storage system;

a determining module, configured to determine, according to the target turning-on time and an initial hot-swap signal output by a hot-swap control chip deployed in the storage system, the target control signal; and a sending module, configured to send the target control signal to the control end.

According to some embodiments of the present disclosure, further provided is a non-volatile computer readable storage medium, storing a computer program therein, and the computer program is configured to, in a case that executed, perform the steps in any one of the method embodiments above.

According to some embodiments of the present disclosure, further provided is an electronic device, including a memory and a processor, and a computer program is stored in the memory, and the processor is configured to execute the computer program to perform the steps in any one of the method embodiments above.

DETAILED DESCRIPTION OF THE EMBODIMENTS

Embodiments of the present disclosure is described in detail with reference to the drawings and in combination with the embodiments hereinafter.

It should be noted that the terms "first", "second", and the like in the description, the claims, and the drawings above of the present disclosure are used to distinguish between similar objects, and are not necessarily used to describe a specific sequence or sequential order.

Figure 1:
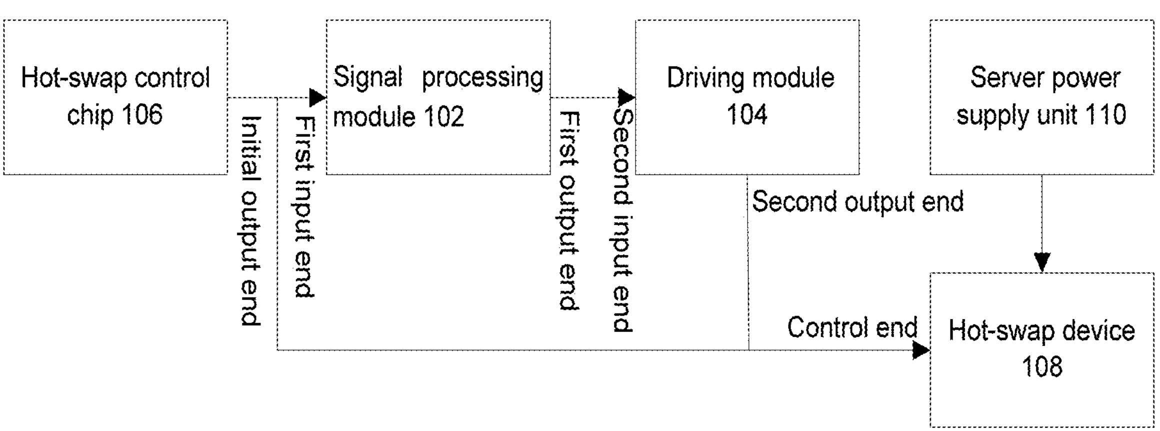
FIG. 1 is a schematic diagram I of an optional power supply control circuit for a storage system according to some embodiments of the present disclosure.

In this embodiment, a power supply control circuit for a storage system is provided. FIG. 1 is a schematic diagram I of an optional power supply control circuit for a storage system according to some embodiments of the present disclosure. As shown in FIG. 1, the power supply control circuit for a storage system includes: a signal processing module 102 and a driving module 104, and a first input end of the signal processing module 102 is connected to an initial output end of a hot-swap control chip 106 deployed in the storage system, a first output end of the signal processing module 102 is connected to a second input end of the driving module 104, a second output end of the driving module 104 is connected to a control end of a hot-swap device 108 deployed in the storage system, and the initial output end is also connected to the control end;

in a case that target turning-on time of the hot-swap device 108 is less than or equal to a time threshold, the driving module 104 connects the second input end to the second output end, the initial output end outputs an initial hot-swap signal to the first input end, the signal processing module 102 converts the initial hot-swap signal into a target hot-swap signal, the first output end outputs the target hot-swap signal to the second input end, and the second output end outputs the target hot-swap signal to the control end, and the target hot-swap signal is greater than the initial hot-swap signal; and the hot-swap device 108 controls, in response to the target hot-swap signal, a server power supply unit 110 deployed in the storage system to supply power to the storage system; and in a case that the target turning-on time of the hot-swap device 108 is greater than the time threshold, the driving module 104 disconnects the second input end from the second output end, and the initial output end outputs the initial hot-swap signal to the control end; and the hot-swap device 108 controls, in response to the initial hot-swap signal, the server power supply unit 110 to supply power to the storage system.

Through the structure above, the signal processing module and the driving module are added to the power supply control circuit for a storage system, and whether the control signal output to the hot-swap device is the initial hot-swap signal or the target hot-swap signal is determined according to the target turning-on time of the hot-swap device. In a case that the target turning-on time is less than or equal to the time threshold, the second input end of the driving module is connected to the second output end thereof, so that the signal processing module is connected to the hot-swap device and the hot-swap device is controlled by means of the target hot-swap signal, thereby speeding up the turning-on of the hot-swap device, shortening the time of turning on a server power supply unit branch, and increasing the speed of powering on the storage system. In a case that the target turning-on time is greater than the time threshold, the second input end of the driving module is disconnected from the second output end thereof, so that the signal processing module is disconnected from the hot-swap device and the hot-swap device is controlled by means of the initial hot-swap signal, thereby slowing down the turning-on of the hot-swap device, increasing the time of turning on the server power supply unit branch, and enabling the control of the hot-swap device to adapt to various working scenarios and working demands of the storage system. Therefore, the problem of low adaptability of the speed of powering on the storage system is solved, thereby improving the adaptability of the speed of powering on the storage system.

Optionally, in this embodiment, the signal processing module above may be, but is not limited to, one or a combination of several circuits, and may also be, but is not limited to, a chip, a processor, etc. that can implement a signal amplification function.

Optionally, in this embodiment, the case where the target turning-on time is greater than the time threshold may be, but is not limited to, a case where the storage system to be controlled is in a normal working state, and the case where the target turning-on time is less than the time threshold may be, but is not limited to, a case where the storage system to be controlled is in a backup power test state.

Figure 2:
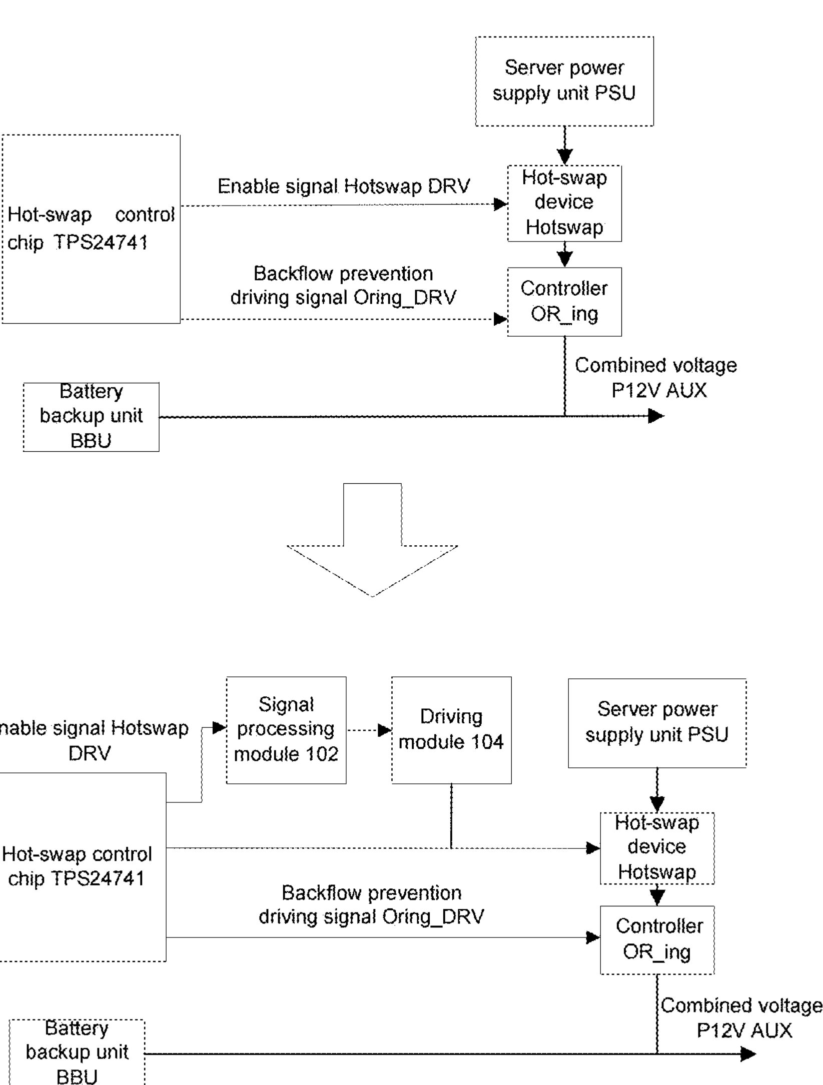
FIG. 2 is a schematic diagram of a power supply control circuit for a storage system according to an optional embodiment of the present disclosure.

In an optional embodiment, a power supply control circuit for a storage system is provided for comparison. FIG. 2 is a schematic diagram of a power supply control circuit for a storage system according to an optional embodiment of the present disclosure. As shown in FIG. 2, the existing power supply control circuit for a storage system may be of the following structure: the hot-swap control chip is TPS24741 which includes two functions. One of the functions is that the hot-swap control chip receives a rising edge of an enable signal Hotswap_EN and then sends a slow-start driving signal Hotswap_DRV, to drive an external metal-oxide-semiconductor (MOS) field-effect transistor (MOSFET) to be slowly turned on, avoiding a large surge current generated in a case that a PSU output voltage is directly applied to a rear-stage capacitor during power-on. The other function is that the chip sends a backflow prevention driving signal ORing_DRV, to drive the external MOS transistor to be turned on in a case that the PSU output voltage is higher than a backup battery unit (BBU) output voltage and to be turned off in a case that the PSU output voltage is lower than the BBU output voltage, preventing the BBU output voltage from being applied to a PSU side due to backflow.

In a case that the storage control system is in a specific working state which has a high requirement for the power-on speed, such as during a one-second power-down test, an operating state of the existing power supply circuit for a storage system is: the enable signal Hotswap_EN is pulled down, a driving signal for the Hotswap is disabled, and BBU_EN is pulled up to enable the BBU to discharge. In this case, a combined voltage P12V_AUX is provided by the BBU. If the BBU module is suddenly pulled out during this period, a complex programmable logic device (CPLD) immediately pulls up Hotswap_EN in a case that detecting that the BBU is not in place, trying to turn on the MOS transistor of the Hotswap to switch the system to PSU power supply. However, the driving signal Hotswap_DRV has a current of only 30 uA. In an example where the power MOS transistor is commonly-used CSD16415, in a case that a gate-source voltage (Vgs) rises to 4.5 V, total gate charge required to fully turn on the MOS transistor is 21 nC, and it takes at least 0.7 ms to drive the MOS transistor to be on with a current of 30 uA. In this case, as the BBU module is pulled out and the PSU branch has not been turned on, the power supply for the system cannot be maintained by relying solely on a motherboard capacitor, causing the system to shut down.

In this optional embodiment, the power supply control circuit for a storage system may be of the following structure: the hot-swap control chip is TPS24741 which includes the following functions. One of the functions is to determine a working state of the storage system. For example, if the storage system is in a startup state, the hot-swap control chip receives a rising edge of an enable signal Hotswap_EN, maintains an enable signal TURBO_EN at a low level at the same time, and then sends a slow-start driving signal Hotswap_DRV to drive an external MOS transistor to be slowly turned on, thereby slowing down the turning-on of the hot-swap device, increasing the time of turning on the server power supply unit branch, and avoiding a large surge current generated in a case that a PSU output voltage is directly applied to a rear-stage capacitor during power-on. If the storage system is in a one-second power-down test state, while receiving the rising edge of the enable signal Hotswap_EN, the hot-swap control chip immediately pulls up the enable signal TURBO_EN, thereby speeding up the turning-on of the hot-swap device, shortening the time of turning on the server power supply unit branch, and increasing the speed of powering on the storage system. The other function is that the chip sends a backflow prevention driving signal ORing_DRV to drive the external MOS transistor to be turned on in a case that the PSU output voltage is higher than a BBU output voltage, and to be turned off in a case that the PSU output voltage is lower than the BBU output voltage, thereby preventing the BBU output voltage from being applied to a PSU side due to backflow.

Optionally, in this embodiment, the signal processing module and the driving module may be added on the basis of the existing power supply control circuit for a storage system, but the present disclosure it not limited thereto. Different control logics for the hot-swap device are determined according to different working states of the storage system. For example, in a case that the storage system is in the startup state, the second input end of the driving module is disconnected from the second output end thereof, so that the signal processing module is disconnected from the hot-swap device and the hot-swap device is controlled by means of the initial hot-swap signal, thereby slowing down the turning-on of the hot-swap device, suppressing the surge current, and avoiding triggering overcurrent protection or even sparking, etc. in a case that the storage system is in the one-second power-down test state, the second input end of the driving module is connected to the second output end thereof, so that the signal processing module is connected to the hot-swap device and the hot-swap device is controlled by means of the target hot-swap signal, thereby speeding up the turning-on of the hot-swap device, shortening the time of turning on the server power supply unit PSU branch, avoiding shut-down of the system caused by pulling out the BBU module during the one-second power-down test, and improving the adaptability of the speed of powering on the storage system.

Figure 3:
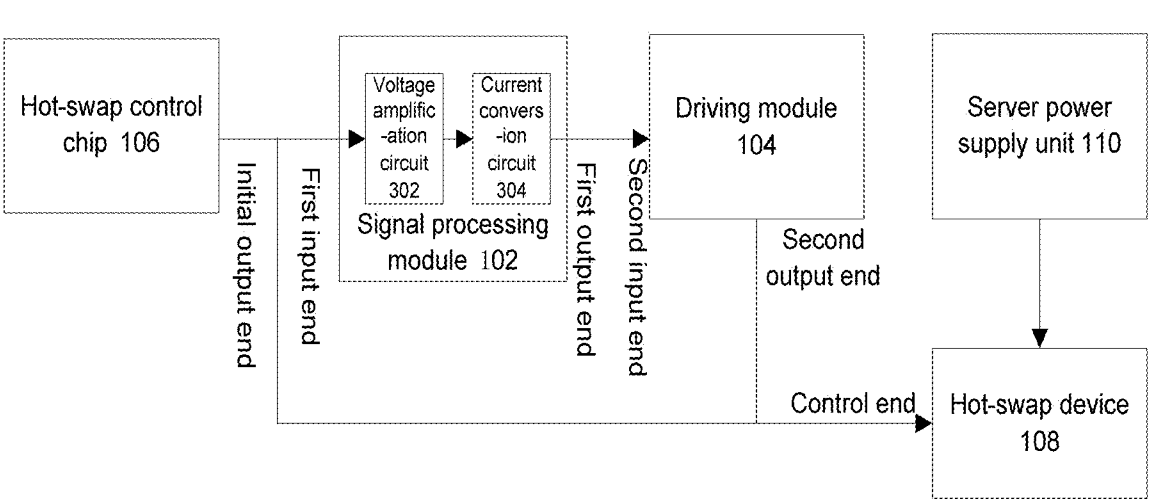
FIG. 3 is a schematic diagram II of an optional power supply control circuit for a storage system according to some embodiments of the present disclosure.

In some embodiments, FIG. 3 is a schematic diagram II of an optional power supply control circuit for a storage system according to some embodiments of the present disclosure. As shown in FIG. 3, the signal processing module 102 includes: a voltage amplification circuit 302 and a current conversion circuit 304, and an input end of the voltage amplification circuit 302 serves as the first input end and is connected to the initial output end, an output end of the voltage amplification circuit 302 is connected to an input end of the current conversion circuit 304, and an output end of the current conversion circuit 304 serves as the first output end and is connected to the second input end; and the voltage amplification circuit 302 amplifies a voltage of the input initial hot-swap signal, to obtain a voltage-amplified signal; and the current conversion circuit 304 converts the voltage-amplified signal into a current-amplified signal and outputs the current-amplified signal as the target hot-swap signal.

Optionally, in this embodiment, a connection sequence of the current conversion circuit and the voltage amplification circuit is not limited, which may be amplifying a current first and then converting the amplified current into a voltage, or may be amplifying a voltage first and then converting the amplified voltage into a current.

Figure 4:
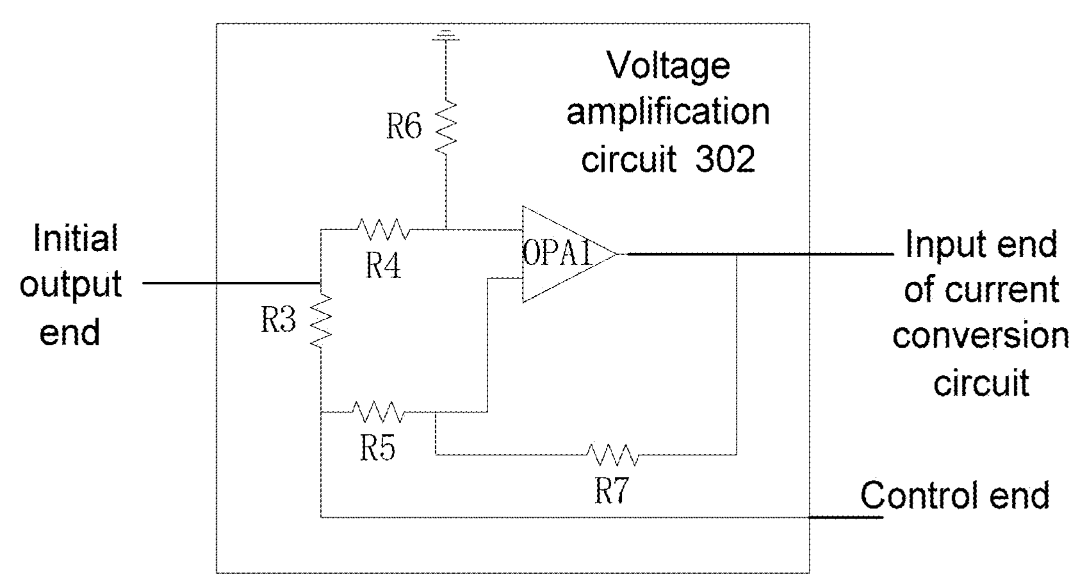
FIG. 4 is a schematic diagram III of an optional power supply control circuit for a storage system according to some embodiments of the present disclosure.

In some embodiments, FIG. 4 is a schematic diagram III of an optional power supply control circuit for a storage system according to some embodiments of the present disclosure. As shown in FIG. 4, the voltage amplification circuit 302 includes: a first resistor (R3), a second resistor (R4), a third resistor (R5), a fourth resistor (R6), a fifth resistor (R7), and a first operational amplifier (OPA1), and a first end of the first resistor (R3) and a first end of the second resistor (R4) are both connected to the initial output end, a second end of the first resistor (R3) and a first end of the third resistor (R5) are both connected to the control end, a second end of the second resistor (R4) and a first end of the fourth resistor (R6) are both connected to an inverting input end of the first operational amplifier (OPA1), a second end of the fourth resistor (R6) is grounded, a second end of the third resistor (R5) and a first end of the fifth resistor (R7) are both connected to a non-inverting input end of the first operational amplifier, and a second end of the fifth resistor (R7) and an output end of the first operational amplifier (OPA1) are both connected to an input end of the current conversion circuit.

Optionally, in this embodiment, the first operational amplifier above may, but is not limited to, have a function of outputting an amplified voltage.

In some embodiments, the second resistor and the third resistor have the same resistance, the fourth resistor and the fifth resistor have the same resistance, and the ratio of the resistance of the second resistor to the resistance of the fourth resistor is used to control an amplification factor of the voltage amplification circuit.

Optionally, this embodiment may select, but is not limited to, R4 (second resistor)=R5 (third resistor)=10 k, and R6

(fourth resistor)=R7 (fifth resistor)=100 k, and accordingly, the amplification factor of the current amplification circuit is A=10.

In some embodiments, the voltage amplification circuit further includes: a diode, and a cathode of the diode is connected to the initial output end, and an anode of the diode is connected to the control end.

Optionally, in this embodiment, the diode D1 has a function of maintaining a quick-off ability of the hot-swap MOS transistor Q4. In a case that detecting overcurrent or overvoltage protection, the hot-swap control chip TPS24741 generates a sink current reaching up to 1 A by means of the Hotswap_DRV, and pulls down the VGS of Q4 by means of the diode D1, quickly turning off Q4, and thereby protecting the MOS transistor and a rear-stage circuit.

Figure 5:
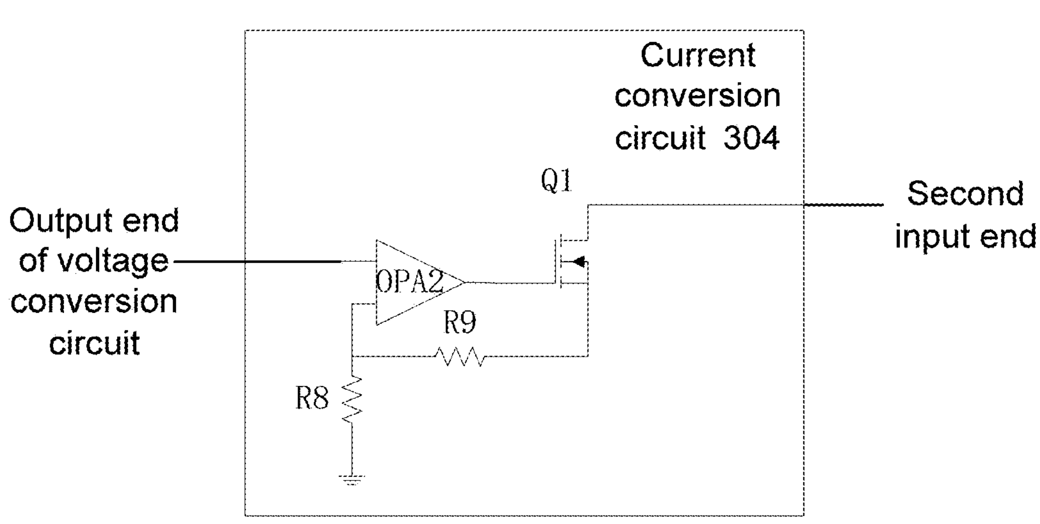
FIG. 5 is a schematic diagram IV of an optional power supply control circuit for a storage system according to some embodiments of the present disclosure.

In some embodiments, FIG. 5 is a schematic diagram IV of an optional power supply control circuit for a storage system according to some embodiments of the present disclosure. As shown in FIG. 5, the current conversion circuit 304 includes: a sixth resistor (R8), a seventh resistor (R9), a second operational amplifier (OPA2), and a first MOS transistor (Q1), and a first end of the sixth resistor (R8) and a first end of the seventh resistor (R9) are both connected to an inverting input end of the second operational amplifier (OPA2), a second end of the sixth resistor (R8) is grounded, a second end of the seventh resistor (R9) is connected to a source of the first MOS transistor (Q1), a non-inverting input end of the second operational amplifier (OPA2) is connected to the output end of the voltage amplification circuit 302, an output end of the second operational amplifier (OPA2) is connected to a gate of the first MOS transistor (Q1), and a drain of the first MOS transistor (Q1) is connected to the second input end.

Figure 6:
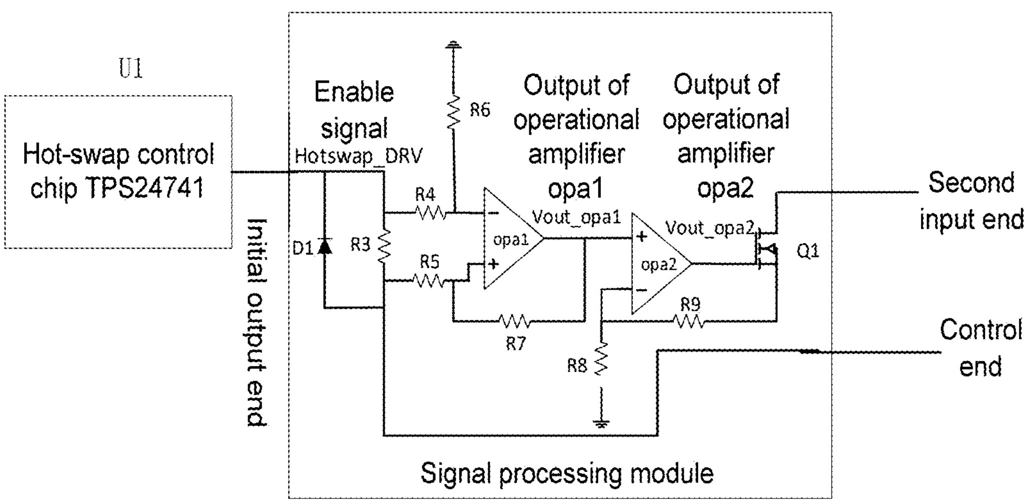
FIG. 6 is a schematic diagram of a signal processing module according to an optional embodiment of the present disclosure.

In an optional embodiment, a voltage amplification circuit and a current conversion circuit are provided. FIG. 6 is a schematic diagram of a signal processing module according to an optional embodiment of the present disclosure. As shown in FIG. 6, the voltage amplification circuit may be a differential amplification circuit composed of a sampling resistor R3, an operational amplifier opa1, and resistors R4, R5, R6 and R7. The hot-swap control chip TPS24741 outputs the Hotswap_DRV signal to drive the gate of the hot-swap MOS transistor Q4 by means of the resistor R3. Since Hotswap_DRV has a driving capacity of only 30 uA, and R3 is set to be 1 k, a voltage difference of 30 mV is generated at two ends of the resistor. If the voltage difference is too large, a driving voltage may be affected, and if the voltage difference is too small, the sampling accuracy may decrease. The voltage difference of dozens of millivolts is an appropriate choice. An amplification factor of the differential amplification circuit is denoted as A. Generally, letting R4=R5 and R6=R7, the amplification factor A may be determined by selecting the ratio of R4 to R6. An output Vout_opa1 of the operational amplifier opa1 is sent to the non-inverting input end of the operational amplifier opa2. The opa2, the resistors R8 and R9, and the MOS transistor Q1 can form the current conversion circuit. The purpose of the current conversion circuit is to generate a current of a magnitude of Vout_opa1/R8 at the drain of Q1, and the direction of the current is from the drain to the source of Q1. The working principle of the current conversion circuit is that: in a case that a voltage of the non-inverting input end of the operational amplifier opa2 is greater than a voltage of the inverting input end thereof, an output voltage Vout_opa2 is raised, to increase the gate-source voltage (Vgs) of Q1, whereby an on-current of Q1 is increased, and the entire on-current of Q1 flows through R8 to raise the voltage of the inverting input end of opa2, eventually forming negative feedback. Similarly, in a case that the voltage of the non-inverting input end of the operational amplifier opa2 is less than the voltage of the inverting input end thereof, a voltage on R8 is reduced through adjustment based on the output of the operational amplifier, to reduce the voltage of the inverting input end, thereby forming negative feedback.

Figure 7:
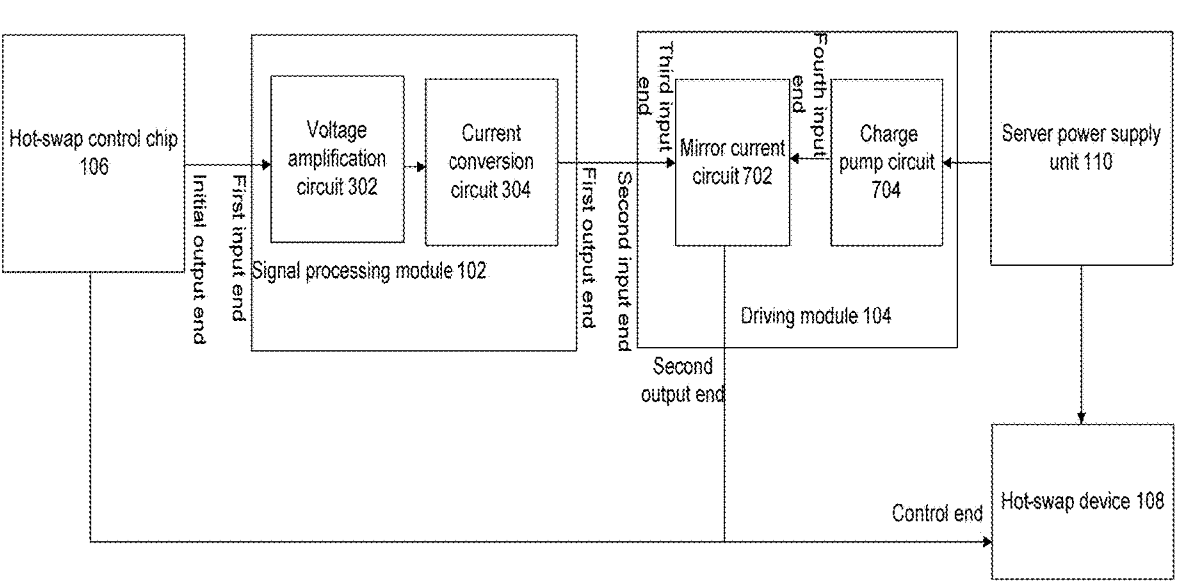
FIG. 7 is a schematic diagram V of an optional power supply control circuit for a storage system according to some embodiments of the present disclosure.

In some embodiments, FIG. 7 is a schematic diagram V of an optional power supply control circuit for a storage system according to some embodiments of the present disclosure. As shown in FIG. 7, the driving module 104 includes: a mirror current circuit 702 and a charge pump circuit 704, and a third input end of the mirror current circuit 702 serves as the second input end and is connected to the first output end, a fourth input end of the mirror current circuit 702 is connected to an output end of the charge pump circuit 704, an output end of the mirror current circuit 702 serves as the second output end and is connected to the control end, and an input end of the charge pump circuit 704 is connected to the server power supply unit 110;

the charge pump circuit 704 controls output of a charge pump signal; in a case that the mirror current circuit 702 receives the charge pump signal at the fourth input end, the third input end is connected to the output end of the mirror current circuit 702; and in a case that no charge pump signal is received at the fourth input end, the third input end is disconnected from the output end of the mirror current circuit 702.

In some embodiments, the mirror current circuit 702 includes: a first triode and a second triode, and an emitter of the first triode is connected to the first output end, a base of the first triode is connected to a base of the second triode, a collector of the first triode and a collector of the second triode are both connected to the output end of the charge pump circuit 704, and an emitter of the second triode is connected to the control end.

In some embodiments, the charge pump circuit 704 includes: a third triode, a fourth triode, an eighth resistor, a ninth resistor, and a charge pump, and a collector of the third triode is connected to the collector of the second triode, an emitter of the third triode and a first end of the ninth resistor are both connected to an output end of the charge pump, a first end of the eighth resistor and a second end of the ninth resistor are both connected to a base of the third triode, a second end of the eighth resistor is connected to a collector of the fourth triode, an emitter of the fourth triode is grounded, and an input end of the charge pump is connected to the server power supply unit 110;

the charge pump doubles an output voltage of the server power supply unit 110 and then transmits the doubled output voltage to the emitter of the third triode and the ninth resistor; and a base of the fourth triode controls the charge pump signal by controlling on and off of the fourth triode and the third triode, and in a case that the fourth triode and the third triode are both turned on, the output end of the charge pump circuit 704 generates the charge pump signal, and in a case that the fourth triode or the third triode is turned off, the output end of the charge pump circuit 704 does not generate the charge pump signal.

Figure 8:
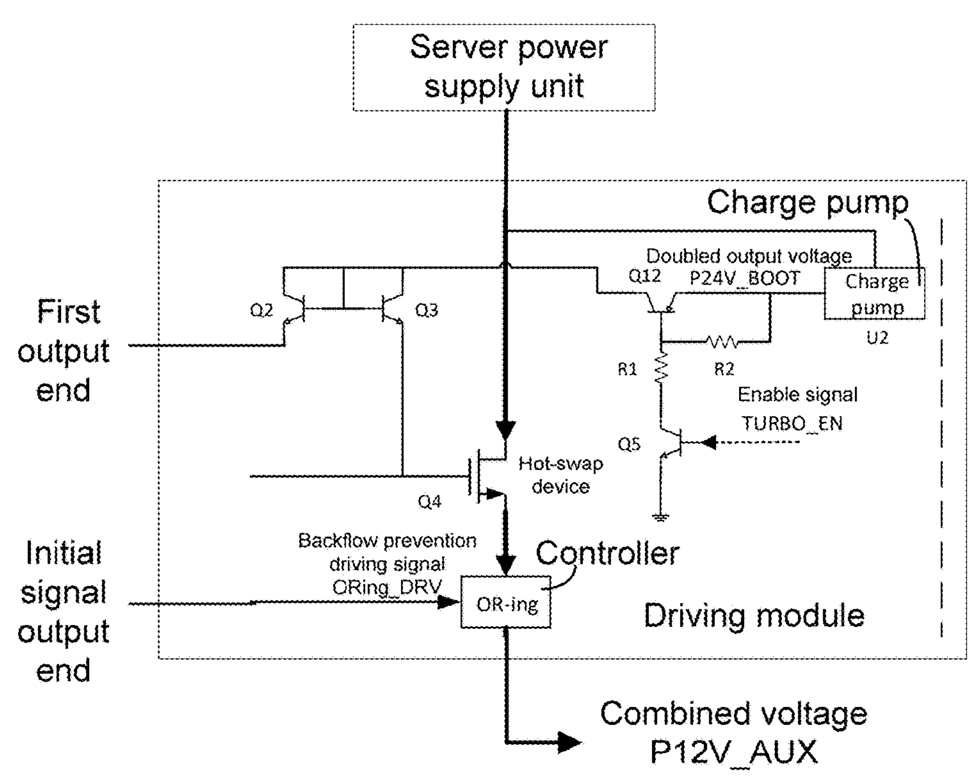
FIG. 8 is a schematic diagram of a driving module according to an optional embodiment of the present disclosure.

In an optional embodiment, a mirror current circuit and a charge pump circuit are provided. FIG. 8 is a schematic diagram of a driving module according to an optional embodiment of the present disclosure. As shown in FIG. 8, the mirror current circuit may be a mirror current source including two NPN triodes Q2 and Q3, and the entire current of Q1 flows through Q2, and a current of the same magnitude also flows through Q3. The current eventually drives the gate of the hot-swap MOS transistor Q4, greatly shortening the turning-on time of the hot-swap MOS transistor. The charge pump circuit may include a charge pump U2, a PNP triode Q12, an NPN triode Q13, and voltage division resistors R1 and R2, and the charge pump U2 has a function of doubling an input voltage PSU_12V and then outputs P24V_BOOT.

In some embodiments, the driving module 104 further includes: a processor, and the processor is connected to the base of the fourth triode; and the processor is configured to: in a case that the target turning-on time is less than or equal to the time threshold, send, to the base of the fourth triode, a first enable signal which is used to turn on the fourth triode, and in a case that the target turning-on time is greater than the time threshold, send, to the base of the fourth triode, a second enable signal which is used to turn off the fourth triode.

Optionally, in this embodiment, the signal processor may include, but is not limited to: a complex programmable logic device (CPLD), a digital signal processor (DSP), a central processing unit (CPU), a control chip, etc.

In some embodiments, the processor is further configured to: detect an operating state of the storage system; in a case that the operating state is a test state, determine that the target turning-on time is less than or equal to the time threshold, and the test state is used to indicate that the storage system is undergoing a backup power test; and in a case that the operating state is a working state, determine that the target turning-on time is greater than the time threshold, and the working state is used to indicate that the storage system is working.

Optionally, in this embodiment, the processor as being a CPLD is used as an example for illustration. The operating states, i.e., control logics of the startup state (i.e., working state) and the one-second power-down test (i.e., test state), of the storage system are distinguished from each other through the CPLD. During the one-second power-down test, the CPLD enables a current amplification function to speed up the turning-on of the hot-swap MOS transistor and shorten the time of turning on the PSU branch, avoiding shut-down of the system caused by pulling out the BBU module during the one-second power-down test. During the startup, the CPLD disables the current amplification function to slow down the turning-on of the hot-swap MOS transistor and suppress the surge current, avoiding triggering overcurrent protection or even sparking, etc.

Figure 9:
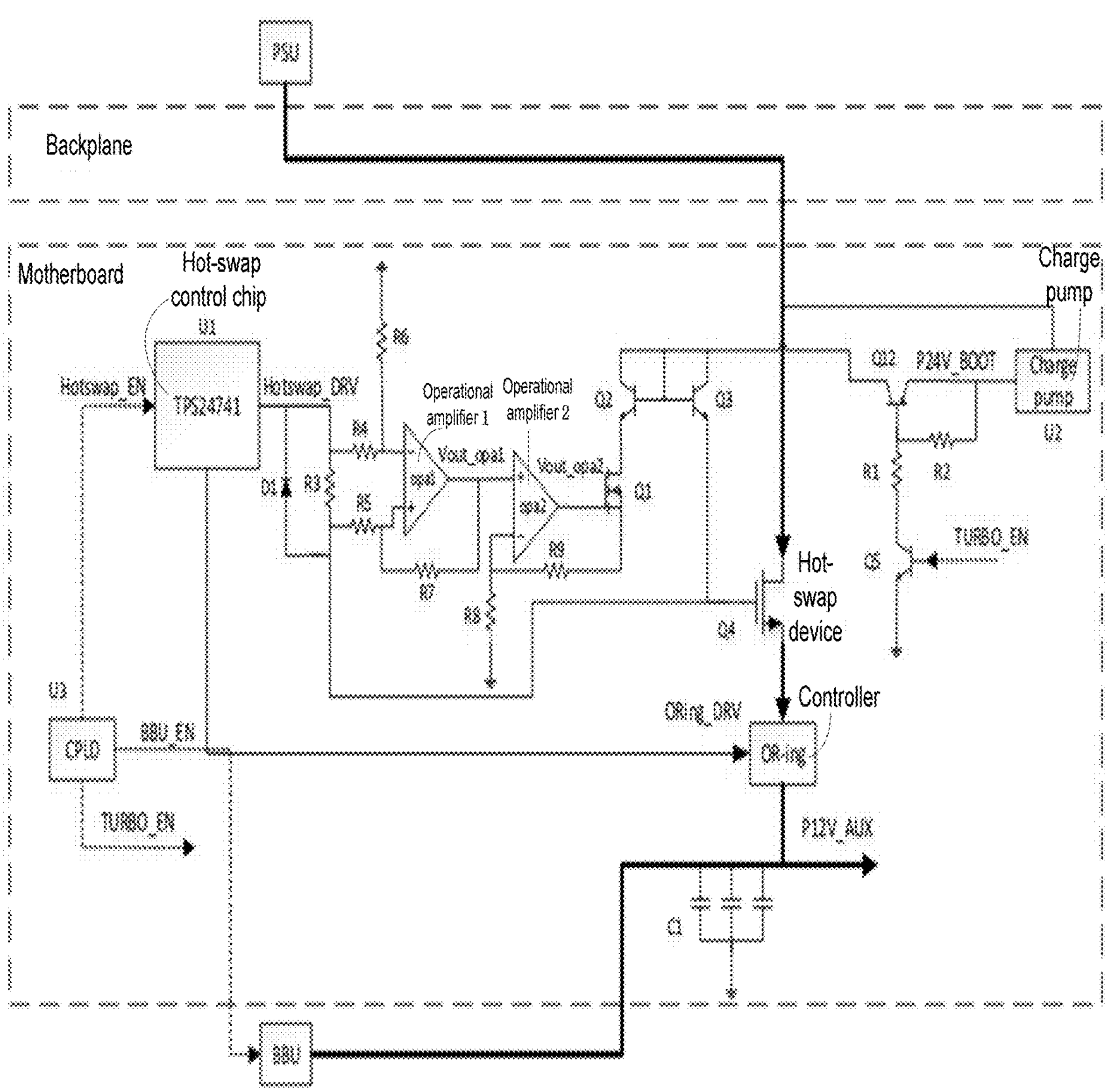
FIG. 9 is a diagram of a power supply control circuit for a storage system according to an optional embodiment of the present disclosure.

In the optional embodiment above, a power supply control circuit for a storage system is provided. FIG. 9 is a diagram of a power supply control circuit for a storage system according to an optional embodiment of the present disclosure. As shown in FIG. 9, in a case that the BBU is accidentally pulled out during the one-second power-down test of the system, it is required to quickly turn on the PSU branch, and the CPLD sends the enable signal TURBO_EN at a high level to drive Q5 to be turned on, a voltage (Vbe) between the base and emitter of the PNP triode Q12 is negatively biased through the voltage division resistors to turn on the PNP triode Q12, and P24V_BOOT supplies power to the mirror current source including Q2 and Q3. Q3 uses the amplified current to drive the hot-swap MOS transistor Q4 to quickly turn on Q4, avoiding shut-down of the system.

Optionally, in this embodiment, the driving current of Q3 is calculated as follows:

$$i_{Q3} = \frac{V_{out\_opa1}}{R8} = 30\ uA \times P \times \frac{R3}{R8}$$

In the formula above, P represents the amplification factor of the differential amplification circuit. For example, if R4=R5=10 k and R6=R7=100 k are selected, P=10. If R3 is set to be 1 k, and R8 is set to be 200 ohms, then the amplification factor of the entire current amplification unit is 50, and ig3 is 1.5 mA. In an example where Q4 is CSD16415 is turned on, in a case that Vgs rises to 4.5 V, the total gate charge required to fully turn on the MOS transistor is 21 nC. The time required to turn on the MOS transistor is calculated, which is only 14 μs, greatly shortening the time of turning on the PSU branch, and thereby avoiding shut-down of the system caused by accidentally pulling out the BBU during the one-second power-down test performed on the system.

During startup of a motherboard, the hot-swap MOS transistor Q4 needs to be slowly turned on to suppress the surge current. The CPLD pulls down the enable signal TURBO_EN, Q12 is turned off, and power supply to the mirror current source by U2 is cut off. In this case, only the Hotswap_DRV signal drives the MOS transistor Q4 through the resistor R3, and the driving current is 30 uA. The small driving current prolongs the turning-on time of the MOS transistor, and fully charging a filter capacitor at P12V_AUX from 0 V to 12 V is slowed down, thereby reducing the charging current (i.e., surge current) and avoiding triggering overcurrent protection or even sparking, etc.

Figure 10:
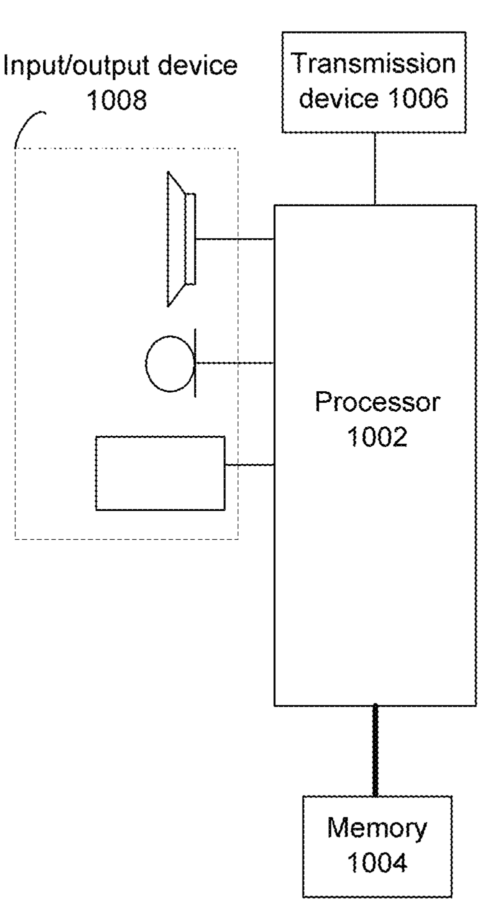
FIG. 10 is a block diagram of a hardware structure of a mobile terminal of a power supply control method for a storage system according to some embodiments of the present disclosure.

A method embodiment provided in the embodiments of the present disclosure can be practiced on a mobile terminal, a computer terminal, or a similar computing apparatus. In an example where the method embodiment is practiced on a mobile terminal, FIG. 10 is a block diagram of a hardware structure of a mobile terminal of a power supply control method for a storage system according to some embodiments of the present disclosure. As shown in FIG. 10, the mobile terminal may include one or more (only one is shown in FIG. 10) processors 1002 (the processor 1002 may include, but is not limited to, a micro control unit (MCU), a field programmable gate array (FPGA), or other processing apparatuses) and a memory 1004 configured to store data. The mobile terminal above may further include a transmission device 1006 configured to implement a communication function and an input/output device 1008. Those of ordinary skill in the art may understand that the structure shown in FIG. 10 is merely illustrative, and does not limit the structure of the mobile terminal above. For example, the mobile terminal may further include more or fewer components than those shown in FIG. 10, or have a configuration different from that shown in FIG. 10.

The memory 1004 may be configured to store a computer program, such as a software program and a module of application software, e.g., a computer program corresponding to the power supply control method for a storage system in this embodiment of the present disclosure. The processor 1002 runs the computer program stored in the memory 1004, to execute various functional applications and data processing, i.e., implement the method above. The memory 1004 may include a high-speed random access memory, or may include a non-volatile memory, such as one or more magnetic storage apparatuses, a flash memory, or other non-volatile solid-state memories. In some examples, the memory 1004 may include a memory configured remotely relative to the processor 1002, and these remote memories may be connected to the mobile terminal over a network. Examples of the network above include, but are not limited to, the Internet, an intranet, a local area network, a mobile communication network and a combination thereof.

The transmission device 1006 is configured to receive or send data over a network. Specific examples of the network above may include a wireless network provided by a communication provider of the mobile terminal. In an example, the transmission device 1006 includes a network interface controller (NIC), which can be connected to other network devices through a base station so as to communicate with the Internet. In an example, the transmission device 1006 may be a radio frequency (RF) module, which is configured to wirelessly communicate with the Internet.

Figure 11:
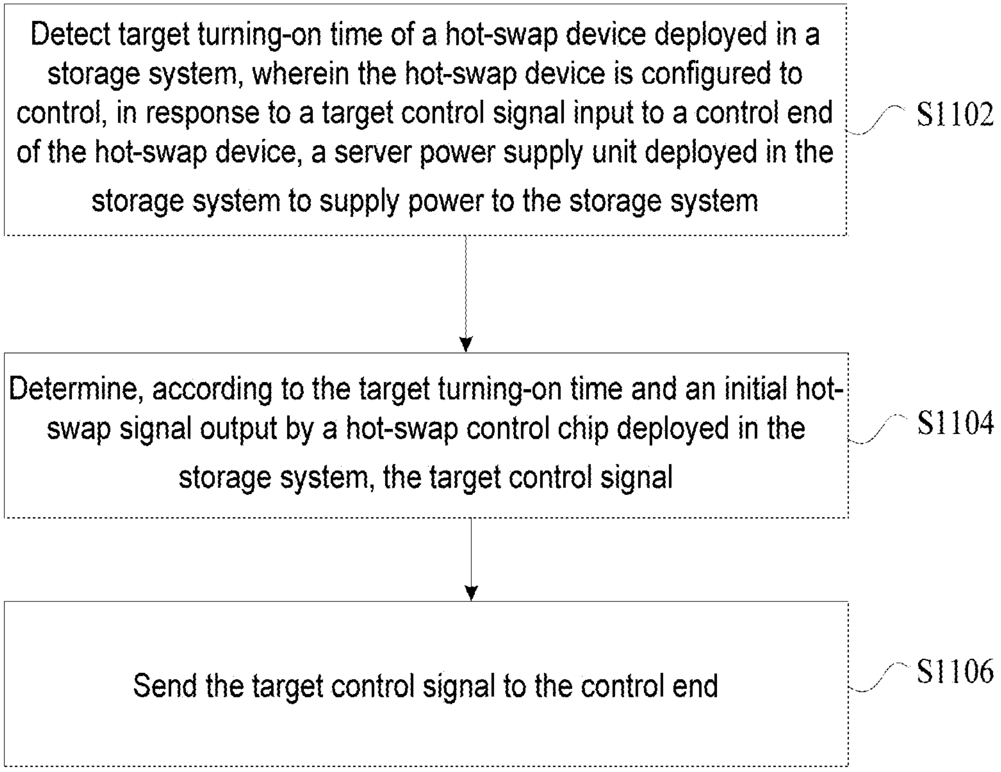
FIG. 11 is a flowchart I of an optional power supply control method for a storage system according to some embodiments of the present disclosure.

A power supply control method for a storage system is provided in this embodiment. FIG. 11 is a flowchart I of an optional power supply control method for a storage system according to some embodiments of the present disclosure. As shown in FIG. 11, the method includes the following steps:

at step S1102, target turning-on time of a hot-swap device deployed in the storage system is detected, and the hot-swap device is configured to control, in response to a target control signal input to a control end of the hot-swap device, a server power supply unit deployed in the storage system to supply power to the storage system;

at step S1104, the target control signal is determined according to the target turning-on time and an initial hot-swap signal output by a hot-swap control chip deployed in the storage system; and at step S1106, the target control signal is sent to the control end.

Through the steps above, the signal processing module and the driving module are added to the power supply control circuit for a storage system, and whether the control signal output to the hot-swap device is the initial hot-swap signal or the target hot-swap signal is determined according to the target turning-on time of the hot-swap device. In a case that the target turning-on time is less than or equal to the time threshold, the second input end of the driving module is connected to the second output end thereof, so that the signal processing module is connected to the hot-swap device and the hot-swap device is controlled by means of the target hot-swap signal, thereby speeding up the turning-on of the hot-swap device, shortening the time of turning on a server power supply unit branch, and increasing the speed of powering on the storage system. In a case that the target turning-on time is greater than the time threshold, the second input end of the driving module is disconnected from the second output end thereof, so that the signal processing module is disconnected from the hot-swap device and the hot-swap device is controlled by means of the initial hot-swap signal, thereby slowing down the turning-on of the hot-swap device, increasing the time of turning on the server power supply unit branch, and enabling the control of the hot-swap device to adapt to various working scenarios and working demands of the storage system. Therefore, the problem of low adaptability of the speed of powering on the storage system is solved, thereby improving the adaptability of the speed of powering on the storage system.

The power supply control method for a storage system as described above may be, but is not limited to be, applied to the signal processor above.

Optionally, in this embodiment, the signal processor may include, but is not limited to: a digital signal processor (DSP), a central processing unit (CPU), a control chip, etc.

In the technical solution provided in step S1102 above, the hot-swap device may be, but is not limited to, a hot-swap MOS transistor, a Universal Serial Bus (USB) hot-swap device, etc. The storage system may be, but is not limited to, a random access memory, a read-only memory, a cache, or a storage device in a physical form, such as a memory bank, a TransFlash (TF) card, etc.

In some embodiments, the target turning-on time of the hot-swap device deployed in the storage system may be, but is not limited to be, detected by: an operating state of the storage system is detected; in a case that the operating state is a test state, it is determined that the target turning-on time is less than or equal to the time threshold, and the test state is used to indicate that the storage system is undergoing a backup power test; and in a case that the operating state is a working state, it is determined that the target turning-on time is greater than the time threshold, and the working state is used to indicate that the storage system is working.

Optionally, in this embodiment, the time threshold may be, but is not limited to be, determined according to the type of the storage system to be controlled. Different time thresholds are set for different types of storage systems.

In some embodiments, the operating state of the storage system may be, but is not limited to be, detected by: it is detected whether the server power supply unit is turned on; in a case that detecting that the server power supply unit is not turned on, it is detected whether the storage system is in a startup state; in a case that detecting that the storage system is in the startup state, it is determined that the operating state is a working state; and in a case that detecting that the storage system is in a non-startup state, it is determined that the operating state is a test state.

Optionally, in this embodiment, if the server power supply unit is turned on, the operating state of the storage system may be determined by detecting the startup state of the storage system.

In the technical solution provided in step S1104 above, a target amplification factor for the initial hot-swap signal may be, but is not limited to be, determined according to the target turning-on time and the initial hot-swap signal output by the hot-swap control chip deployed in the storage system, thereby determining the target control signal according to the target amplification factor.

Optionally, in this embodiment, the hot-swap control chip may be, but is not limited to, a digital signal processor (DSP), a central processing unit (CPU), a control chip, etc.

In some embodiments, the target control signal may be, but is not limited to be, determined, according to the target turning-on time and the initial hot-swap signal output by the hot-swap control chip deployed in the storage system, by: in a case that the target turning-on time is greater than the time threshold, the initial hot-swap signal is determined as the target control signal; and in a case that the target turning-on time is less than or equal to the time threshold, signal conversion is performed on the initial hot-swap signal to obtain the target control signal, and the target control signal is greater than the initial hot-swap signal.

Optionally, in this embodiment, in a case that the target turning-on time is greater than the time threshold, the target control signal does not need to be amplified to speed up the turning-on of the hot-swap device, and the target control signal is the initial hot-swap signal. In a case that the target turning-on time is less than the time threshold, the target control signal needs to be greater than the initial hot-swap signal to speed up the turning-on of the hot-swap device.

In some embodiments, to obtain the target control signal, the signal conversion may be, but is not limited to be, performed on the initial hot-swap signal by:

a voltage of the initial hot-swap signal is amplified to obtain a voltage-amplified signal; and the voltage-amplified signal is converted into a current-amplified signal to obtain the target hot-swap signal as the target control signal.

Optionally, in this embodiment, an order of performing the signal conversion on the initial hot-swap signal is not limited, which may be first amplifying the voltage of the initial hot-swap signal to obtain a voltage-amplified signal and then converting the voltage-amplified signal into a current-amplified signal to obtain the target hot-swap signal as the target control signal. Alternatively, the order may be first amplifying the current of the initial hot-swap signal to obtain a current-amplified signal and then converting the current-amplified signal into a voltage-amplified signal to obtain the target hot-swap signal as the target control signal.

In some embodiments, to obtain a voltage-amplified signal, the voltage of the initial hot-swap signal may be, but is not limited to be, amplified by: a voltage amplification factor is determined according to the target on-time; and voltage amplification is performed on the initial hot-swap signal according to the voltage amplification factor to obtain the voltage-amplified signal.

Optionally, in this embodiment, the voltage amplification factor may be, but is not limited to be, adjusted according to parameters of a circuit element deployed in a signal control module.

In some embodiments, the target control signal may be, but is not limited to be, determined, according to the target turning-on time and the initial hot-swap signal output by the hot-swap control chip deployed in the storage system, by: the hot-swap control chip is controlled to output the initial hot-swap signal; and the signal processing module is controlled to be turned on or off according to a relationship between the target turning-on time and the time threshold, and the signal processing module is connected between the hot-swap control chip and the control end, the hot-swap control chip is also connected to the control end; in a case that the signal processing module is turned on, the signal processing module performs signal conversion on the initial hot-swap signal to obtain the target control signal; and in a case that the signal processing module is turned off, the initial hot-swap signal serves as the target control signal.

Optionally, in this embodiment, the selection of the hot-swap signal may be, but is not limited to be, controlled by controlling the on or off of the signal processing module. If the signal processing module is turned on, the signal processing module may perform the hot-swap signal conversion function thereof to convert the initial hot-swap signal into the target control signal, thereby controlling the turning-on of the hot-swap device. If the signal processing module is turned off, the initial hot-swap signal is directly used as the target control signal to control the turning-on of the hot-swap device.

In some embodiments, the on or off of the signal processing module may be, but is not limited to be, controlled, according to the relationship between the target turning-on time and the time threshold, by: in a case that the target turning-on time is less than or equal to the time threshold, the signal processing module is controlled to be turned on; and in a case that the target turning-on time is greater than the time threshold, the signal processing module is controlled to be turned off.

Optionally, in this embodiment, the relationship between the target turning-on time and the time threshold may be, but is not limited to be, determined according to the working state of the storage system to be controlled.

Figures 12, 13:
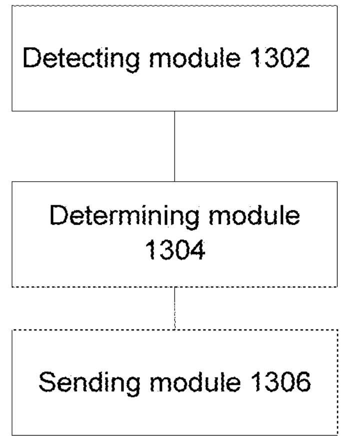
FIG. 12 is a flowchart II of an optional power supply control method for a storage system according to some embodiments of the present disclosure.
FIG. 13 is a structural block diagram of a power supply control apparatus for a storage system according to some embodiments of the present disclosure.

In an optional implementation, an optional power supply control process for a storage system is provided. FIG. 12 is a flowchart II of an optional power supply control method for a storage system according to some embodiments of the present disclosure. As shown in FIG. 12, first, the CPLD detects whether the PSU branch is turned on currently, and if the PSU branch is not turned on currently, determines whether a current state is the startup state or the one-second power-down test state. If the current PSU branch is started up, the CPLD disables the current amplification function in a case that controlling the PSU branch to be turned on. The CPLD pulls up the Hotswap_EN signal and maintains TURBO_EN at a low level, Q5 and Q12 are turned off, and a path of supplying power to the mirror current source by the charge pump is off. The slow-start driving signal Hotswap_DRV has a current of 30 uA flowing through the resistor R3 to charge the gate of Q4, slowly turning on the hot-swap MOS transistor Q4, and thereby avoiding an excessive surge current. In an example where Q4 is CSD16415, in a case that Vgs rises to 4.5 V, the total gate charge required to fully turn on the MOS transistor is 21 nC, and it takes 0.7 ms to turn on the MOS transistor.

If the CPLD determines that the current state is the one-second power-down test state, in a case that detecting that the BBU is pulled out or receiving a test end command sent by the CPU, the CPLD immediately pulls up the Hotswap_EN signal and also pulls up TURBO_EN at the same time, Q5 is turned on, Vbe of Q12 is negatively biased through the voltage division resistors R1 and R2 to turn on Q12, and the path of supplying power to the mirror current source by the charge pump is on. The 30 uA current of Hotswap_DRV is amplified with a factor of 50 to obtain a 1.5 mA current, which then charges the gate of Q4, thereby quickly turning on the hot-swap MOS transistor Q4. Taking CSD16415 as an example, the turning-on time is 14 μs. This time is sufficient to enable the filter capacitor at the rear-stage P12V_AUX to support power supply to the system, thereby avoiding shut-down of the system. in a case that the PSU branch is fully on, the gate voltage of Q4 may be maintained relying only on Hotswap_DRV, and the current amplification unit is no longer required. Therefore, after a latency of 100 ms, TURBO_EN is pulled down again to reset the signal and disable BBU discharge.

Through the description above of the embodiments, those skilled in the art could clearly learn that the method in the embodiments above may be implemented with software and a necessary general-purpose hardware platform or with hardware, while in many cases the former is a preferable implementation. On the basis of such an understanding, the essence or a portion contributing to the prior art of the technical solutions of the present disclosure may be embodied in the form of a software product. The computer software product is stored in a non-volatile readable storage medium (such as a ROM/RAM, a diskette, or an optical disk), and includes several instructions used to enable a terminal device (which may be a cell phone, a computer, a server, a network device, etc.) to perform the method of each embodiment of the present disclosure.

A power supply control apparatus for a storage system is further provided in this embodiment, and the apparatus is configured to implement the embodiments and optional embodiments above, and the description is no longer repeated here. As used hereinafter, the term "module" may be a combination of software and/or hardware that implements a predetermined function. Although the apparatus described in the following embodiment is preferably implemented in software, an implementation in hardware or a combination of software and hardware is possible and conceivable.

FIG. 13 is a structural block diagram of a power supply control apparatus for a storage system according to some embodiments of the present disclosure. As shown in FIG. 13, the apparatus includes:

a detecting module 1302, configured to detect target turning-on time of a hot-swap device deployed in the storage system, and the hot-swap device is configured to control, in response to a target control signal input to a control end of the hot-swap device, a server power supply unit deployed in the storage system to supply power to the storage system;

a determining module 1304, configured to determine, according to the target turning-on time and an initial hot-swap signal output by a hot-swap control chip deployed in the storage system, the target control signal; and a sending module 1306, configured to send the target control signal to the control end.

Through the apparatus above, the signal processing module and the driving module are added to the power supply control circuit for a storage system, and whether the control signal output to the hot-swap device is the initial hot-swap signal or the target hot-swap signal is determined according to the target turning-on time of the hot-swap device. In a case that the target turning-on time is less than or equal to the time threshold, the second input end of the driving module is connected to the second output end thereof, so that the signal processing module is connected to the hot-swap device and the hot-swap device is controlled by means of the target hot-swap signal, thereby speeding up the turning-on of the hot-swap device, shortening the time of turning on a server power supply unit branch, and increasing the speed of powering on the storage system. In a case that the target turning-on time is greater than the time threshold, the second input end of the driving module is disconnected from the second output end thereof, so that the signal processing module is disconnected from the hot-swap device and the hot-swap device is controlled by means of the initial hot-swap signal, thereby slowing down the turning-on of the hot-swap device, increasing the time of turning on the server power supply unit branch, and enabling the control of the hot-swap device to adapt to various working scenarios and working demands of the storage system. Therefore, the problem of low adaptability of the speed of powering on the storage system is solved, thereby improving the adaptability of the speed of powering on the storage system.

In some embodiments, the determining module includes:

a first determining unit, configured to, in a case that the target turning-on time is greater than a time threshold, determine the initial hot-swap signal as the target control signal; and a conversion unit, configured to, in a case that the target turning-on time is less than or equal to the time threshold, perform signal conversion on the initial hot-swap signal to obtain the target control signal, and the target control signal is greater than the initial hot-swap signal.

In some embodiments, the conversion unit is configured to:

amplify a voltage of the initial hot-swap signal to obtain a voltage-amplified signal; and convert the voltage-amplified signal into a current-amplified signal to obtain a target hot-swap signal as the target control signal.

In some embodiments, the conversion unit is configured to:

determine a voltage amplification factor according to the target turning-on time; and amplify, according to the voltage amplification factor, the voltage of the initial hot-swap signal to obtain the voltage-amplified signal.

In some embodiments, the determining module further includes:

a first control unit, configured to control the hot-swap control chip to output the initial hot-swap signal; and a second control unit, configured to control on or off of the signal processing module according to a relationship between the target turning-on time and the time threshold, and the signal processing module is connected between the hot-swap control chip and the control end, the hot-swap control chip is also connected to the control end; in a case that the signal processing module is turned on, the signal processing module performs signal conversion on the initial hot-swap signal to obtain the target control signal; and in a case that the signal processing module is turned off, the initial hot-swap signal serves as the target control signal.

In some embodiments, the second control unit is configured to:

in a case that the target turning-on time is less than or equal to the time threshold, control the signal processing module to be on; and in a case that the target turning-on time is greater than the time threshold, control the signal processing module to be off.

In some embodiments, the detecting module further includes:

a detecting unit, configured to detect an operating state of the storage system;

a second determining unit, configured to, in a case that the operating state is a test state, determine that the target turning-on time is less than or equal to the time threshold, and the test state is configured to indicate that the storage system is undergoing a backup power test; and a third determining unit, configured to, in a case that the operating state is a working state, determine that the target turning-on time is greater than the time threshold, and the working state is configured to indicate that the storage system is working.

In some embodiments, the detecting unit is configured to:

detect whether the server power supply unit is turned on;

in a case that detecting that the server power supply unit is not turned on, detect whether the storage system is in a startup state;

in a case that detecting that the storage system is in the startup state, determine that the operating state is a working state; and in a case that detecting that the storage system is in a non-startup state, determine that the operating state is a test state.

It should be noted that each of the modules above may be realized by software or hardware. In the case of hardware, the modules can be realized by, but is not limited thereby: all the modules above are in the same processor; or the modules above are separately located in different processors in the form of any combination.

Some embodiments of the present disclosure further provides a non-volatile computer readable storage medium, storing a computer program therein, and the computer program is configured to, in a case that executed, perform the steps in any one of the method embodiments above.

In some embodiments, the non-volatile computer readable storage medium above may include, but is not limited to, various media capable of storing computer programs, such as a USB flash disk, a read-only memory (ROM), a random access memory (RAM), a mobile hard disk, a magnetic disk, and an optical disk.

Some embodiments of the present disclosure further provides an electronic device, including a memory and a processor, and the memory stores a computer program, and the processor is configured to execute the computer program to perform the steps in any one of the method embodiments above.

In some embodiments, the electronic device above may further include a transmission device and an input/output device, and the transmission device is connected to the processor above, and the input/output device is connected to the processor above.

Specific examples in this embodiment may refer to the examples described in the embodiments and exemplary embodiments above, and are no longer repeated here in this embodiment.

Apparently, those skilled in the art should understand that the modules or steps above of the present disclosure may be implemented with a general-purpose computing apparatus. The modules or steps can be centralized on a single computing apparatus or distributed on a network formed by a plurality of computing apparatuses, can be implemented with program codes executable by the computing apparatus, and thus can be stored in a storage apparatus and executed by the computing apparatus. Moreover, in some cases, the steps shown or described may be performed in an order different from the order here or be separately produced as individual integrated circuit modules, or a plurality of the modules or steps may be produced and implemented as a single integrated circuit module. As such, the present disclosure is not limited to any particular combination of hardware and software.

The embodiments above are merely optional embodiments of the present disclosure and are not intended to limit the present disclosure. For those skilled in the art, the present disclosure may have various modifications and variations. Any modification, equivalent substitution, improvement and the like made within the principle of the present disclosure shall all fall in the scope of protection of the present disclosure.

What is claimed is:

1. A power supply control circuit for a storage system, comprising: a signal processing module and a driving module, wherein a first input end of the signal processing module is connected to an initial output end of a hot-swap control chip deployed in the storage system, a first output end of the signal processing module is connected to a second input end of the driving module, a second output end of the driving module is connected to a control end of a hot-swap device deployed in the storage system, and the initial output end is also connected to the control end;

in a case that target turning-on time of the hot-swap device is less than or equal to a time threshold, the driving module connects the second input end to the second output end, the initial output end outputs an initial hot-swap signal to the first input end, the signal processing module converts the initial hot-swap signal into a target hot-swap signal, the first output end outputs the target hot-swap signal to the second input end, and the second output end outputs the target hot-swap signal to the control end, wherein the target hot-swap signal is greater than the initial hot-swap signal; the hot-swap device controls, in response to the target hot-swap signal, a server power supply unit deployed in the storage system to supply power to the storage system; and in a case that the target turning-on time of the hot-swap device is greater than the time threshold, the driving module disconnects the second input end from the second output end, and the initial output end outputs the initial hot-swap signal to the control end; and the hot-swap device controls, in response to the initial hot-swap signal, the server power supply unit to supply power to the storage system; and wherein the signal processing module comprises: a voltage amplification circuit and a current conversion circuit, wherein an input end of the voltage amplification circuit serves as the first input end and is connected to the initial output end, an output end of the voltage amplification circuit is connected to an input end of the current conversion circuit, and an output end of the current conversion circuit serves as the first output end and is connected to the second input end; and the voltage amplification circuit amplifies a voltage of the input initial hot-swap signal, to obtain a voltage-amplified signal; and the current conversion circuit converts the voltage-amplified signal into a current-amplified signal and outputs the current-amplified signal as the target hot-swap signal.

2. The power supply control circuit for a storage system according to claim 1, wherein the voltage amplification circuit comprises: a first resistor, a second resistor, a third resistor, a fourth resistor, a fifth resistor, and a first operational amplifier, wherein a first end of the first resistor and a first end of the second resistor are both connected to the initial output end, a second end of the first resistor and a first end of the third resistor are both connected to the control end, a second end of the second resistor and a first end of the fourth resistor are both connected to an inverting input end of the first operational amplifier, a second end of the fourth resistor is grounded, a second end of the third resistor and a first end of the fifth resistor are both connected to a non-inverting input end of the first operational amplifier, and a second end of the fifth resistor and an output end of the first operational amplifier are both connected to an input end of the current conversion circuit.

3. The power supply control circuit for a storage system according to claim 2, wherein the second resistor and the third resistor have the same resistance, the fourth resistor and the fifth resistor have the same resistance, and the ratio of the resistance of the second resistor to the resistance of the fourth resistor is used to control an amplification factor of the voltage amplification circuit.

4. The power supply control circuit for a storage system according to claim 2, wherein the voltage amplification circuit further comprises: a diode, wherein a cathode of the diode is connected to the initial output end, and an anode of the diode is connected to the control end.

5. The power supply control circuit for a storage system according to claim 1, wherein the current conversion circuit comprises: a sixth resistor, a seventh resistor, a second operational amplifier, and a first metal-oxide-semiconductor MOS field-effect transistor, wherein a first end of the sixth resistor and a first end of the seventh resistor are both connected to an inverting input end of the second operational amplifier, a second end of the sixth resistor is grounded, a second end of the seventh resistor is connected to a source of the first MOS transistor, a non-inverting input end of the second operational amplifier is connected to the output end of the voltage amplification circuit, an output end of the second operational amplifier is connected to a gate of the first MOS transistor, and a drain of the first MOS transistor is connected to the second input end.

6. The power supply control circuit for a storage system according to claim 1, wherein the driving module comprises: a mirror current circuit and a charge pump circuit, wherein a third input end of the mirror current circuit serves as the second input end and is connected to the first output end, a fourth input end of the mirror current circuit is connected to an output end of the charge pump circuit, an output end of the mirror current circuit serves as the second output end and is connected to the control end, and an input end of the charge pump circuit is connected to the server power supply unit; and the charge pump circuit controls output of a charge pump signal; in a case that the mirror current circuit receives the charge pump signal at the fourth input end, the third input end is connected to the output end of the mirror current circuit; and in a case that no charge pump signal is received at the fourth input end, the third input end is disconnected from the output end of the mirror current circuit.

7. The power supply control circuit for a storage system according to claim 6, wherein the mirror current circuit comprises: a first triode and a second triode, wherein an emitter of the first triode is connected to the first output end, a base of the first triode is connected to a base of the second triode, a collector of the first triode and a collector of the second triode are both connected to the output end of the charge pump circuit, and an emitter of the second triode is connected to the control end.

8. The power supply control circuit for a storage system according to claim 7, wherein the charge pump circuit comprises: a third triode, a fourth triode, an eighth resistor, a ninth resistor, and a charge pump, wherein a collector of the third triode is connected to the collector of the second triode, an emitter of the third triode and a first end of the ninth resistor are both connected to an output end of the charge pump, a first end of the eighth resistor and a second end of the ninth resistor are both connected to a base of the third triode, a second end of the eighth resistor is connected to a collector of the fourth triode, an emitter of the fourth triode is grounded, and an input end of the charge pump is connected to the server power supply unit;

the charge pump doubles an output voltage of the server power supply unit and then transmits the doubled output voltage to the emitter of the third triode and the ninth resistor; and a base of the fourth triode controls the charge pump signal by controlling on and off of the fourth triode and the third triode, wherein in a case that the fourth triode and the third triode are both turned on, the output end of the charge pump circuit generates the charge pump signal, and in a case that the fourth triode or the third triode is turned off, the output end of the charge pump circuit does not generate the charge pump signal.

9. The power supply control circuit for a storage system according to claim 8, wherein the driving module further comprises: a processor, wherein the processor is connected to the base of the fourth triode; and the processor is configured to: in a case that the target turning-on time is less than or equal to the time threshold, send, to the base of the fourth triode, a first enable signal which is used to turn on the fourth triode, and in a case that the target turning-on time is greater than the time threshold, send, to the base of the fourth triode, a second enable signal which is used to turn off the fourth triode.

10. The power supply control circuit for a storage system according to claim 9, wherein the processor is further configured to:

detect an operating state of the storage system;

in a case that the operating state is a test state, determine that the target turning-on time is less than or equal to the time threshold, wherein the test state is used to indicate that the storage system is undergoing a backup power test; and in a case that the operating state is a working state, determine that the target turning-on time is greater than the time threshold, wherein the working state is used to indicate that the storage system is working.

11. A power supply control method for a storage system, comprising:

detecting target turning-on time of a hot-swap device deployed in the storage system, wherein the hot-swap device is configured to control, in response to a target control signal input to a control end of the hot-swap device, a server power supply unit deployed in the storage system to supply power to the storage system;

determining, according to the target turning-on time and an initial hot-swap signal output by a hot-swap control chip deployed in the storage system, the target control signal; and sending the target control signal to the control end;

wherein determining, according to the target turning-on time and the initial hot-swap signal output by the hot-swap control chip deployed in the storage system, the target control signal comprises:

in a case that the target turning-on time is greater than a time threshold, determining the initial hot-swap signal as the target control signal; and in a case that the target turning-on time is less than or equal to the time threshold, performing signal conversion on the initial hot-swap signal to obtain the target control signal, wherein the target control signal is greater than the initial hot-swap signal; and wherein the power supply control method for a storage system is applied to a power supply control circuit for the storage system, and the power supply control circuit comprises a signal processing module and a driving module, wherein a first input end of the signal processing module is connected to an initial output end of the hot-swap control chip, a first output end of the signal processing module is connected to a second input end of the driving module, a second output end of the driving module is connected to a control end of the hot-swap device, and the initial output end is also connected to the control end; the driving module is configured to disconnect the second input end from the second output end in a case that the target turning-on time is greater than the time threshold, and the driving module is further configured to connect the second input end to the second output end in a case that the target turning-on time is less than or equal to the time threshold; and the power supply control circuit is configured to perform signal conversion on the initial hot-swap signal by means of the signal processing module in a case that the target turning-on time is less than or equal to the time threshold; and wherein performing signal conversion on the initial hot-swap signal to obtain the target control signal comprises:

amplifying a voltage of the initial hot-swap signal to obtain a voltage-amplified signal; and converting the voltage-amplified signal into a current-amplified signal to obtain a target hot-swap signal as the target control signal.

12. The method according to claim 11, wherein amplifying a voltage of the initial hot-swap signal to obtain a voltage-amplified signal comprises:

determining a voltage amplification factor according to the target turning-on time; and amplifying, according to the voltage amplification factor, the voltage of the initial hot-swap signal to obtain the voltage-amplified signal.

13. The method according to claim 11, wherein determining, according to the target turning-on time and the initial hot-swap signal output by the hot-swap control chip deployed in the storage system, the target control signal comprises:

controlling the hot-swap control chip to output the initial hot-swap signal; and controlling on or off of the signal processing module according to a relationship between the target turning-on time and the time threshold, wherein the signal processing module is connected between the hot-swap control chip and the control end, the hot-swap control chip is also connected to the control end; in a case that the signal processing module is on, the signal processing module performs signal conversion on the initial hot-swap signal to obtain the target control signal; and in a case that the signal processing module is off, the initial hot-swap signal serves as the target control signal.

14. The method according to claim 13, wherein controlling on or off of the signal processing module according to the relationship between the target turning-on time and the time threshold comprises:

in a case that the target turning-on time is less than or equal to the time threshold, controlling the signal processing module to be on; and in a case that the target turning-on time is greater than the time threshold, controlling the signal processing module to be off.

15. The method according to claim 11, wherein detecting target turning-on time of the hot-swap device deployed in the storage system comprises:

detecting an operating state of the storage system;

in a case that the operating state is a test state, determining that the target turning-on time is less than or equal to the time threshold, wherein the test state is used to indicate that the storage system is undergoing a backup power test; and in a case that the operating state is a working state, determining that the target turning-on time is greater than the time threshold, wherein the working state is used to indicate that the storage system is working.

16. The method according to claim 15, wherein detecting the operating state of the storage system comprises:

detecting whether the server power supply unit is on;

in a case that detecting that the server power supply unit is not on, detecting whether the storage system is in a startup state;

in a case that detecting that the storage system is in the startup state, determining that the operating state is a working state; and in a case that detecting that the storage system is in a non-startup state, determining that the operating state is a test state.

* * * * *